(12) United States Patent
Kuroda et al.

(10) Patent No.: US 6,358,089 B1
(45) Date of Patent: Mar. 19, 2002

(54) CONNECTOR FOR PRINTED WIRING BOARD

(75) Inventors: Keiji Kuroda, Hyogo; Kiyoshi Aramoto, Osaka, both of (JP)

(73) Assignee: J.S.T. Mfg. Co., LTD, Osaka (JP)

( * ) Notice: Subject to any disclaimer, the term of this patent is extended or adjusted under 35 U.S.C. 154(b) by 0 days.

(21) Appl. No.: 09/583,908

(22) Filed: May 31, 2000

(30) Foreign Application Priority Data

Jul. 26, 1999 (JP) .......................................... 11-210229

(51) Int. Cl.⁷ ............................................ H01R 13/648
(52) U.S. Cl. ......................... 439/607; 439/79; 439/680
(58) Field of Search ............................ 439/79, 80, 607, 439/610, 609, 680

(56) References Cited

U.S. PATENT DOCUMENTS

| | | | | |
|---|---|---|---|---|
| 4,741,708 A | * | 5/1988 | Yoshida ...................... | 439/483 |
| 5,281,169 A | * | 1/1994 | Kiat et al. ................... | 439/607 |
| 5,660,558 A | * | 8/1997 | Osanai et al. ................ | 439/353 |
| 5,772,471 A | * | 6/1998 | Buck .......................... | 439/607 |

FOREIGN PATENT DOCUMENTS

JP 10-270125 10/1998

\* cited by examiner

*Primary Examiner*—Hien Vu
*Assistant Examiner*—Truc Nguyen
(74) *Attorney, Agent, or Firm*—Rader, Fishman & Grauer, PLLC

(57) ABSTRACT

A connector includes a connector body having an insertion space for receiving its counterpart connector. The connector body includes a synthetic-resin housing for retaining contacts, and a metallic shell. A part of the insertion space is defined by an upper plate of the shell. The upper plate of the shell has extensions extended therefrom along corresponding side walls of the housing. The extensions include legs soldered to a conductive portion on a printed wiring board surface. The legs are outwardly extended and confined in an outline of the connector body as viewed in plan.

19 Claims, 7 Drawing Sheets

CONNECTOR FOR PRINTED WIRING BOARD

CROSS REFERENCE TO RELATED APPLICATION

This application claims the benefit under 35 U.S.C. §119 of Japanese Patent Application No.11-210229 filed on Jul. 26, 1999, the abstract of disclosure of which is incorporated herein by reference.

BACKGROUND OF THE INVENTION

1. Field of the Invention

The present invention relates to electrical connectors mounted on printed wiring boards.

2. Description of Related Art

Typically, the connector of this type has a synthetic-resin housing surrounded by a shell for shielding against electromagnetic interference. Being formed of metal, the shell also contributes to the increased strength of a connector structure.

In applications in small electronic devices such as cellular phones, the connectors of this type are required of being compact and small in height (thin design).

For accomplishing the thin design, a connector has been provided by, for example, Japanese Patent Laid-Open Gazette No.10-270125 (1998) wherein an upper plane of an insertion space is defined by an upper plate of the shell. That is, the synthetic-resin housing includes a cut away portion, which is outlined by the shell alone.

Unfortunately, the shell is formed of a thin sheet, causing a problem that the connector may be decreased in strength. On this account, the shell is provided with reinforcement tabs which extend outwardly (laterally outward) from lower ends of lateral sides thereof along a conductive pattern on the printed wiring board and are securely soldered to the conductive pattern.

However, the connector occupies a greater area on the printed wiring board because of the reinforcement tabs projecting outwardly of the connector body as viewed in plan.

An arrangement for interconnection between the shell and the housing may be made such that the shell is formed with engagement holes in its lateral sides while lateral sides of the housing are integrally formed with resilient projections to be fitted in the engagement holes. However, adequate elastic deformation is not provided by such resilient projections of the housing because a hard synthetic resin material is selected for forming the housing. Besides, the resilient projections of the hard synthetic resin are prone to become worn or chipped due to contact with the side surfaces of the shell. This results in decreased strength of the interconnection between the shell and the housing.

On the other hand, the arrangement of the above official gazette for accomplishing the thin design has a problem that the part outlined by the shell alone may be more susceptible to deformation associated with the shell deflection. Particularly, the shell is prone to be deformed when prised by a socket connector being inserted in or removed from the insertion space.

SUMMARY OF THE INVENTION

It is an object of the invention to provide a connector for printed wiring board featuring the compact, thin design capable of ensuring the strength.

In accordance with a preferred aspect of the invention for achieving the above object, a connector for printed wiring board having an insertion space for receiving its counterpart connector comprises a connector body mounted on a printed wiring board. The connector body includes a synthetic-resin housing for retaining a plurality of contacts, and a metallic shell as an electromagnetic shield covering the housing. The housing includes a pair of side walls. The shell includes an upper plate defining a part of the insertion space. The upper plate has a pair of extensions individually extended therefrom along the corresponding side walls. The pair of extensions correspondingly include a pair of legs located within an outline of the connector body as viewed in plan. The pair of legs are extended outward on a surface of the printed wiring board and soldered to a conductive portion on the printed wiring board surface.

The aspect accomplishes the thin connector design by adopting a construction wherein a part of the insertion space is defined by the upper plate of the shell. In addition, the connector occupies a smaller area on the printed wiring board because the connector is secured to the printed wiring board by the legs of the extensions which are confined in an outline of the connector body. The outwardly extended legs provide easy repair of any solder failure found in the fabrication process.

Further, it is preferable that the pair of side walls are each formed with a recess at a lower part of an outside surface thereof, and the pair of extensions correspondingly include a pair of bent portions inwardly projected and accommodated in the corresponding recesses of the side walls. Particularly, it is more preferable when the pair of bent portions correspondingly include the pair of legs.

Since inwardly projecting bent portions with the legs are accommodated in recesses of the side walls of the housing, even the outwardly extended legs can be confined in the outline of the connector body as viewed in plan.

DESCRIPTION OF THE PREFERRED EMBODIMENT

A preferred embodiment of the invention will be described with reference to the accompanying drawings.

Figure 1:
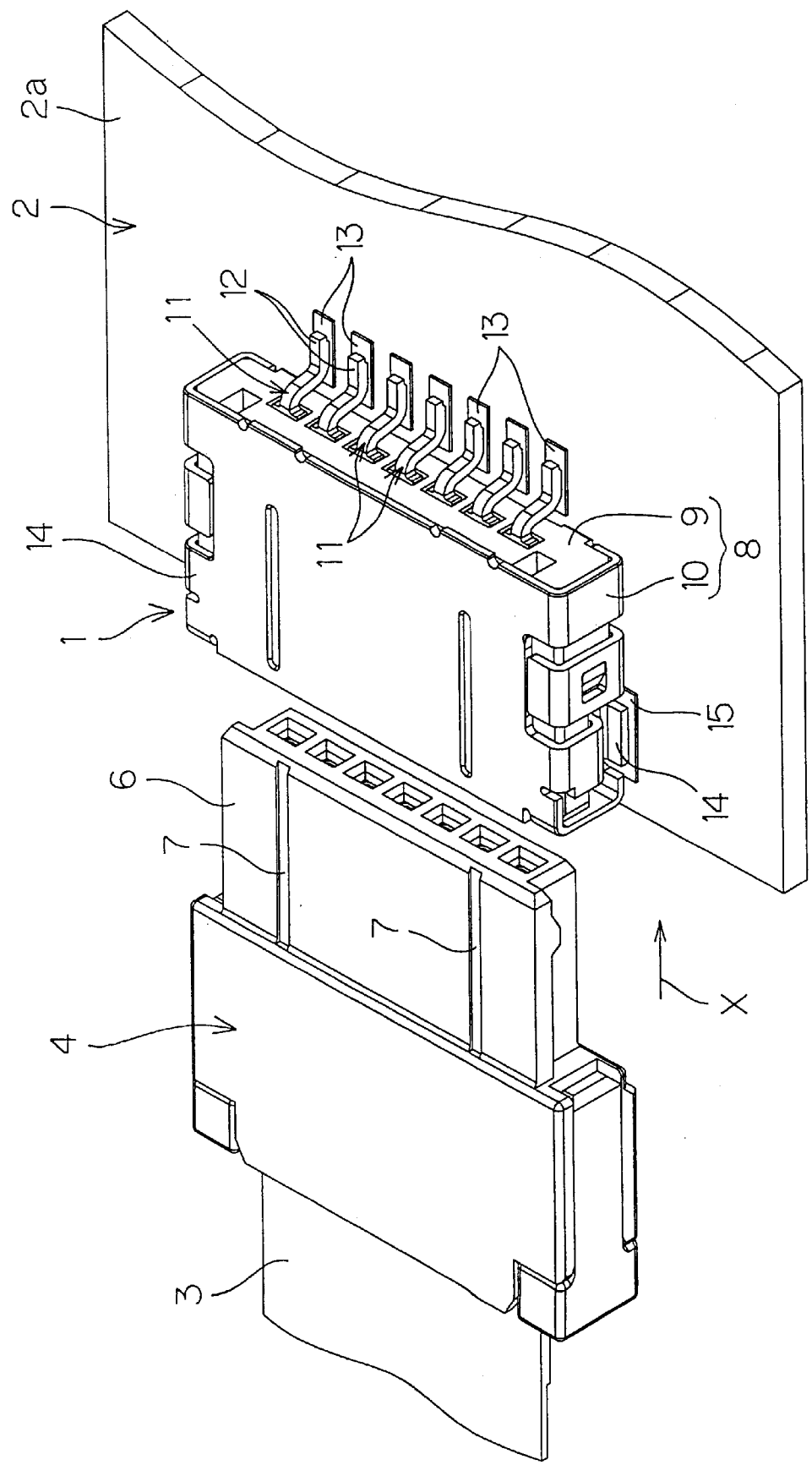
FIG. 1 is an exploded perspective view showing a base connector as a connector for printed wiring board according to one embodiment of the invention and a socket connector as its counterpart.

Referring to FIG. 1, a base connector 1 is mounted on a surface 2a of a printed wiring board 2 so as to be connected with a socket connector 4 forming a pair with the base connector and connected to an end of a flexible printed circuit 3, also known as FPC. The socket connector 4 includes an insertable projection 6 adopted to be removably inserted in an insertion space 5 (see FIG. 6) of the base connector 1, which will be described hereinlater. The insertable projection 6 is formed with a pair of grooves 7 on its upper surface, the grooves extending parallel to a direction X of insertion of the socket connector 4.

Figure 2:
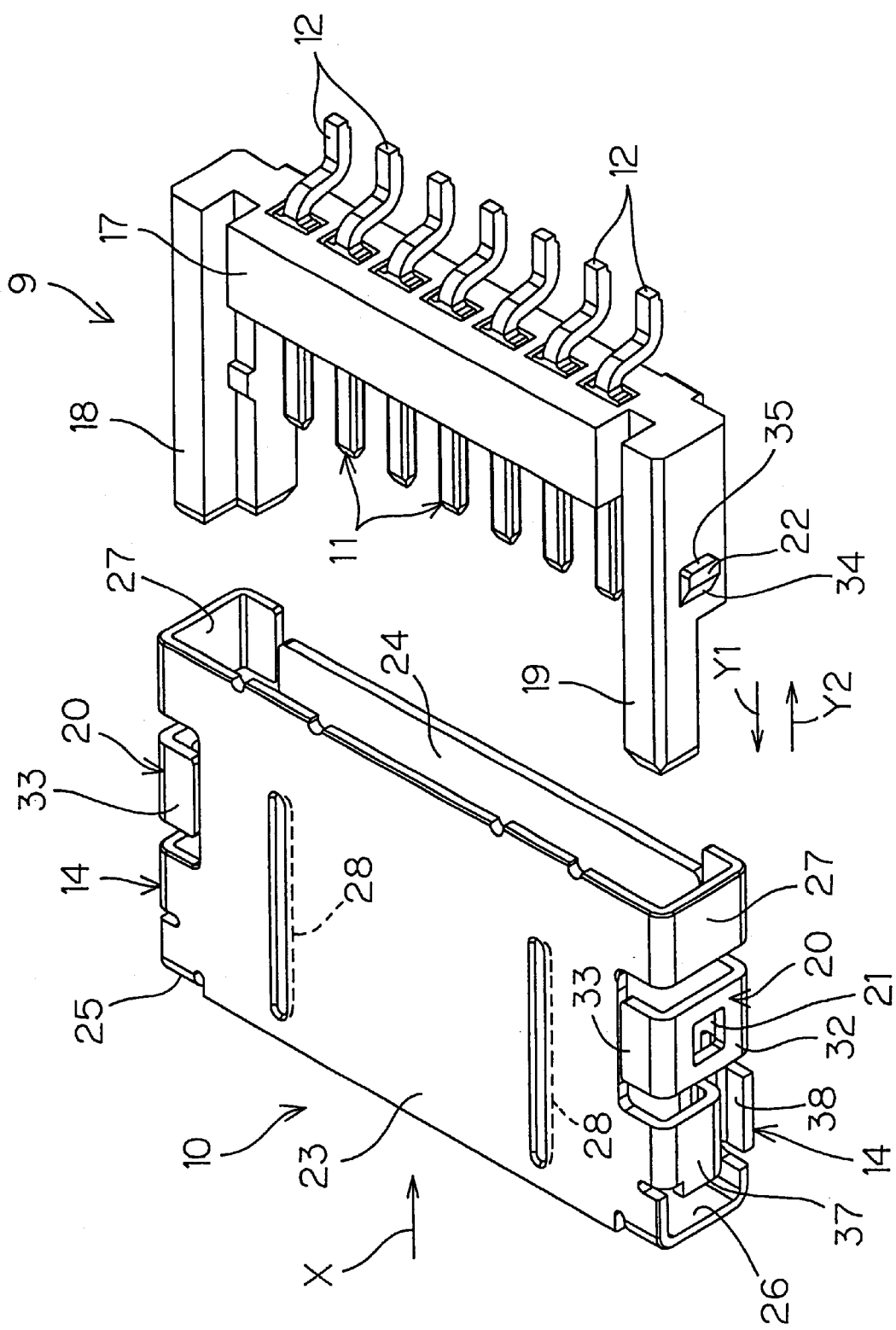
FIG. 2 is an exploded perspective view showing a housing and a shell.

As seen in FIGS. 1 and 2, the base connector 1 includes a connector body 8. The connector body 8 includes a housing 9 formed of a synthetic resin material, and a shell 10 formed of a metal sheet and serving as an electromagnetic shield cover.

Turning to FIG. 1, the base connector 1 is arranged as follows. A contact 11 is exposed to outside, having its lead 12 soldered to a conductive portion 13 formed, by patterning, on the printed wiring board 2. On the other hand, a reinforcement tab 14, an extension integrally extended from the shell 10, is soldered to a conductive portion 15 formed, by patterning, on the printed wiring board 2.

Figure 3:
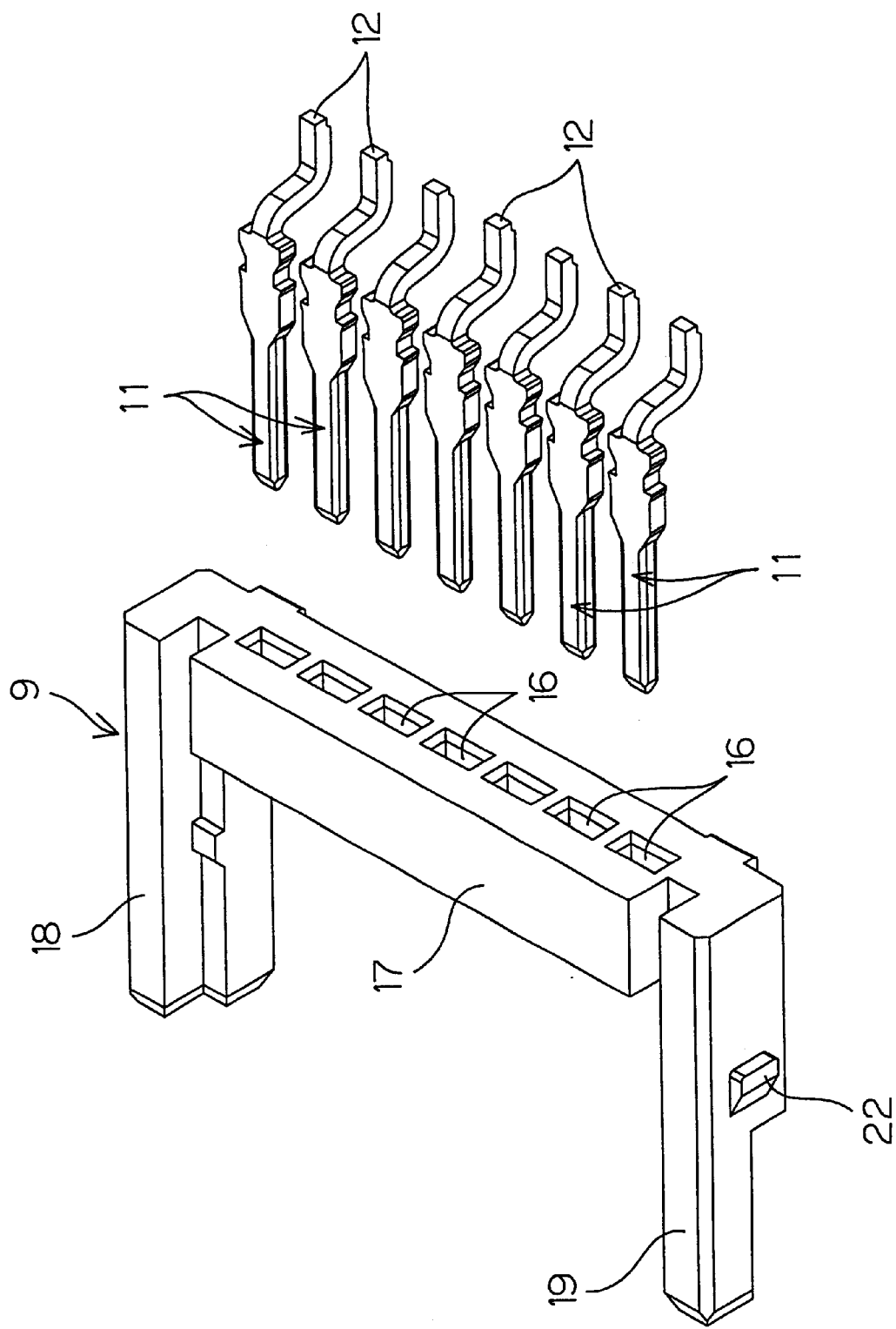
FIG. 3 is an exploded perspective view showing contacts and the housing.

In FIGS. 2 and 3, the housing 9 includes a rear wall 17 formed with a plurality of contact through holes 16 in side-by-side relation, and a pair of side walls 18, 19 extending forwardly from opposite ends of the rear wall 17. The housing 9 retains the plural contacts 11 as allowing them to pass through the contact through holes 16, respectively.

Outside surfaces of the side walls 18, 19 are integrally formed with engaging projections 22 to be fitted in engagement holes 21 defined in resilient tongues 20 of the shell 10 (FIGS. 2 and 3 illustrate only one of the engaging projections 22).

Figure 4:
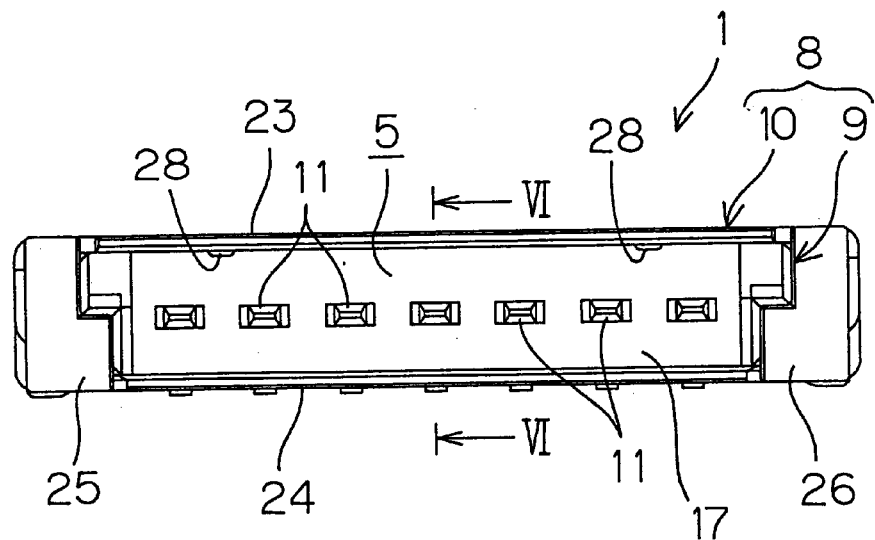
FIG. 4 is a front view showing the base connector.
Figure 5:
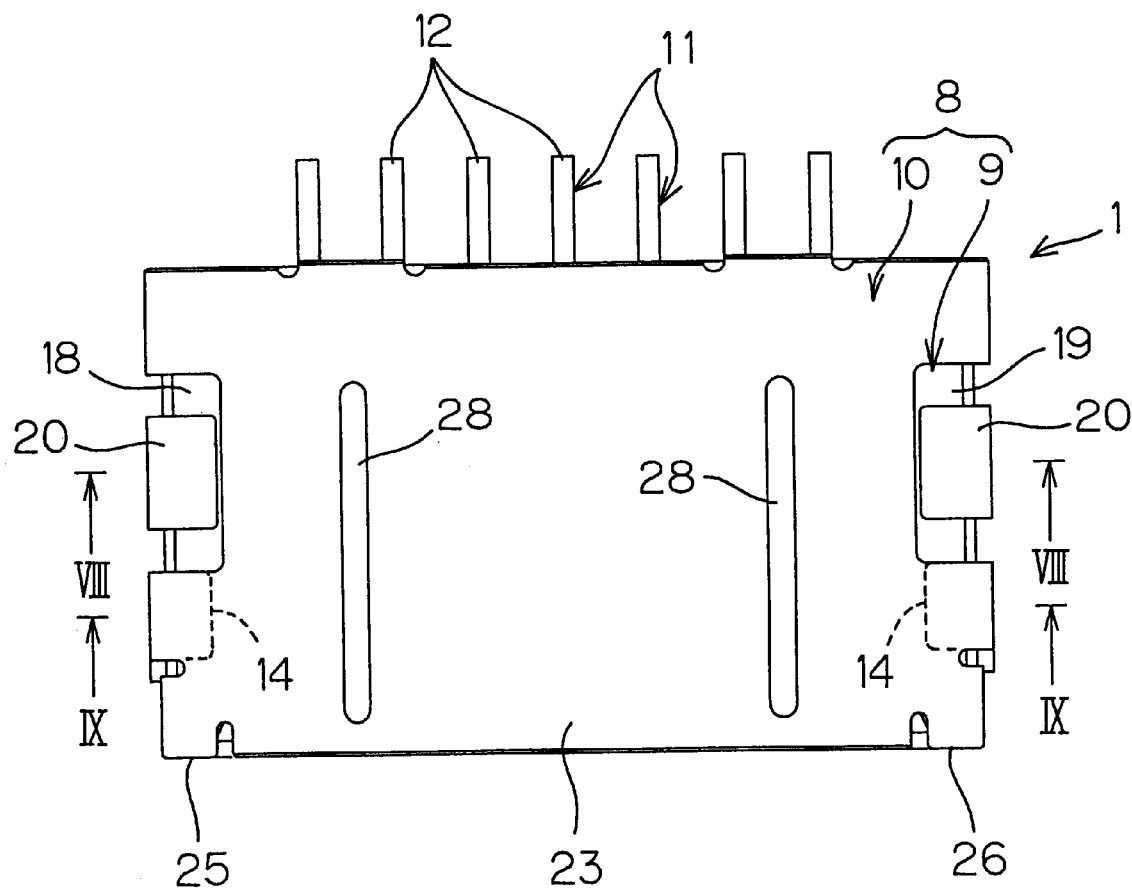
FIG. 5 is a plan view showing the base connector.

FIGS. 4 and 5 are a front view and a plan view showing the base connector 1. Referring to FIGS .2, 4 and 5, the shell 10 essentially includes an upper plate 23, a lower plate 24 and lateral front plates 25, 26 interconnecting the upper and lower plates 23, 24.

Figure 6:
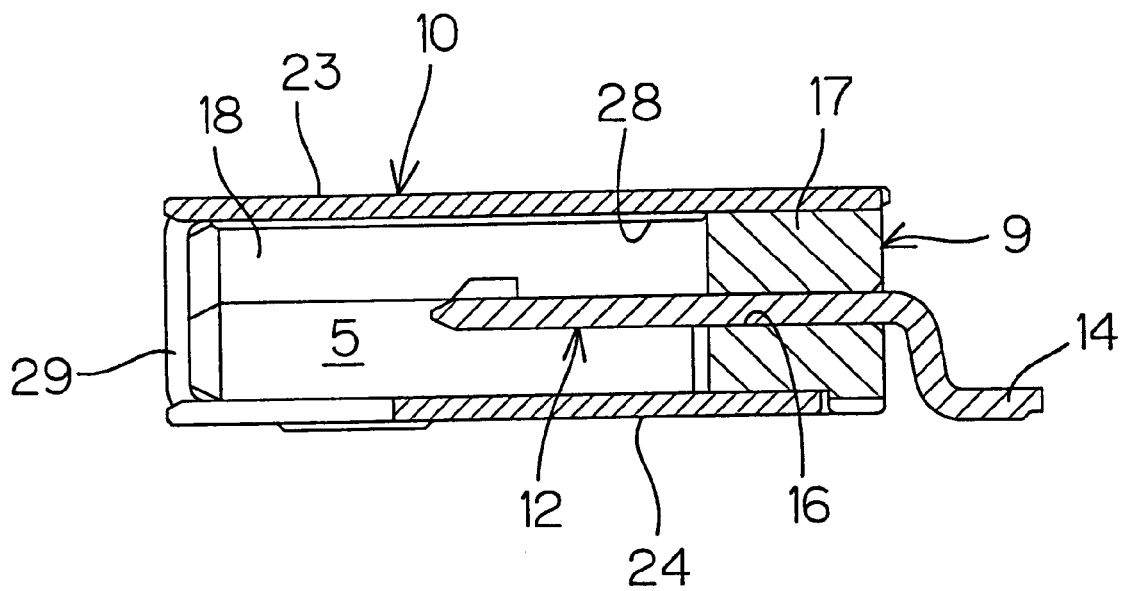
FIG. 6 is a sectional view taken on the line VI—VI in FIG. 4.

As shown in FIG. 6, the insertion space 5 of the base connector 1 opens forwardly via an insertion opening 29. An upper plane of the insertion space 5 is defined by the upper plate 23 of the shell 10. A lower plane of the insertion space 5 is defined by the lower plate 24 of the shell 10 and the surface 2a (not shown in FIG. 6) of the printed wiring board 2. Lateral side planes of the insertion space 5 are defined by the lateral side walls 18, 19 of the housing 9 (only the side wall 18 is shown in FIG. 6). A rear plane of the insertion space 5 is defined by the rear wall 17 of the housing 9.

Turning back to FIGS. 2, 4 and 5, the reinforcement tabs 14 and side plates 27 substantially of L-shaped in section are extended downward from lateral side edges of the upper plate 23. The reinforcement tab 14 is located at a place close to a front end of the shell 10 whereas the side plate 27 is located at a rear end of the shell 10. The upper plate 23 is formed with a pair of hollow guide ribs 28 projecting toward the lower plate 24 (or toward the insertion space 5). The guide ribs 28 extend parallel to the insertion direction X in transversely spaced arrangement. The guide ribs 28 projecting into the insertion space 5 slide in the corresponding grooves 7 of the insertable projection 6 of the socket connector 4 being inserted in or removed from the insertion space 5, thereby guiding the socket connector 4 in movement into or out of the insertion space. The pair of resilient tongues 20 substantially of L-shaped in section extend upward from places intermediate lateral side edges of the lower plate 24, respectively.

Figure 7:
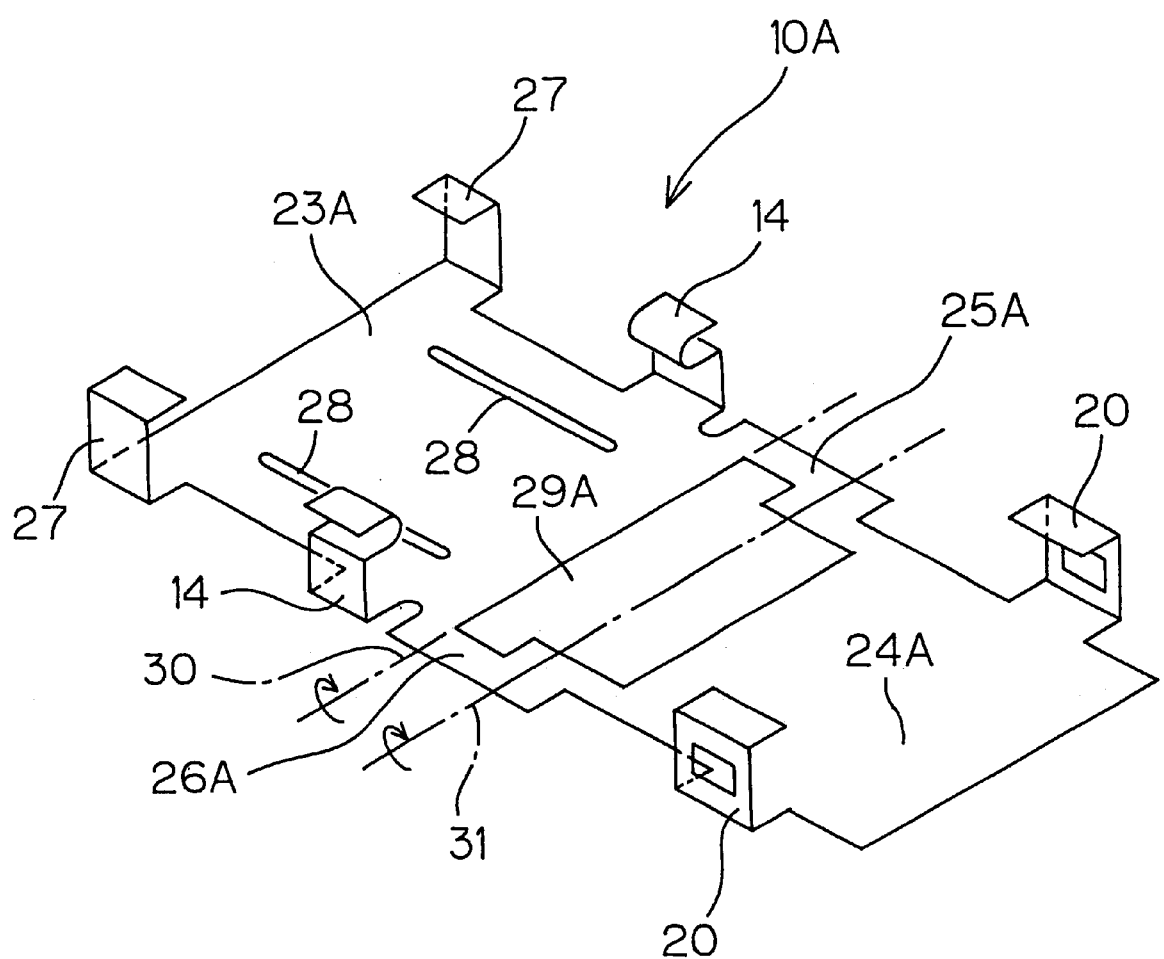
FIG. 7 is a schematic perspective view showing an intermediate for fabricating the shell.

The shell 10 is made of an intermediate 10A such as shown in FIG. 7, which is prepared by the steps of blanking a piece of metal sheet by means of a press, and bending it at required portions into shape. In FIG. 7, portions 23A and 24A define the upper plate 23 and the lower plate 24, respectively. Portions 25A and 26A define the front plate 25 and the front plate 26, respectively. A portion 29A defines with a part thereof the insertion opening 29. In the intermediate 10A, the portion 23A defining the upper plate 23 is coplanar with the portion 24A defining the lower plate 24. Besides, the pair of reinforcement tabs 14 and side plates 27 are already formed on the portion 23A defining the upper plate 23. Similarly, the pair of resilient tongues 20 is already formed on the portion 24A defining the lower plate 24.

Figure 8:
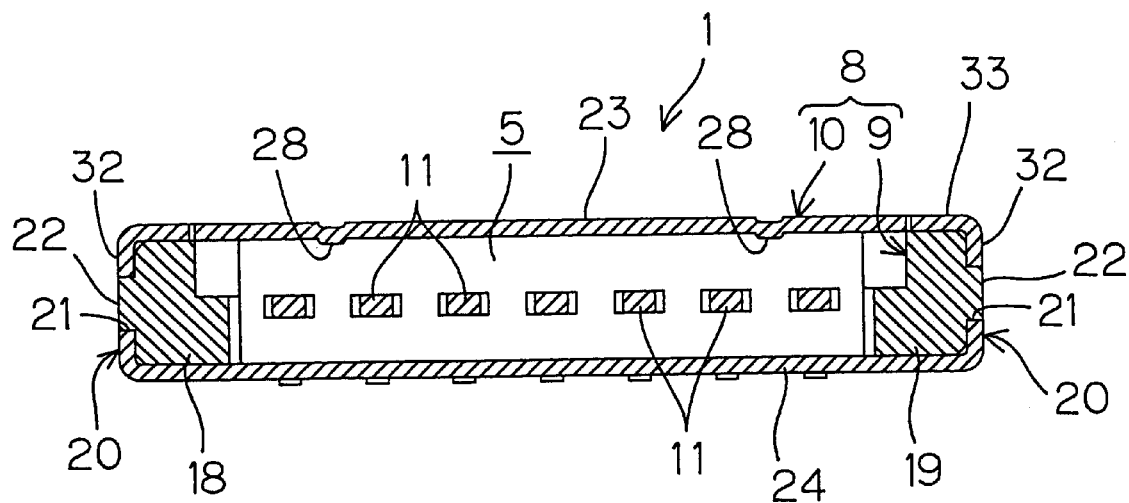
FIG. 8 is a sectional view taken on the line VIII—VIII in FIG. 5.

Bending the intermediate 10A into a 90° angle on respective bend lines 30, 31 will give a structure of the shell 10 shown in FIG. 2. The portion 23A defining the upper plate 23 and the portion 24A defining the lower plate 24 are brought into parallel relation by bending the intermediate in the same direction that the unfolded reinforcement tabs 14 and resilient tongues 20 are previously bent. Thus, the whole shell body is fabricated in an easy manner to bend the required portions of the intermediate sequentially in the same direction. Referring to FIGS. 2 and 8, the resilient tongue 20 includes a main body 32 and a pressure piece 33. The main body 32 extends upward from the lower plate 24 along an outside surface of each side wall 18, 19 of the housing 9. The pressure piece 33 extends inwardly from a top end of the main body 32 along an upper surface of each side wall 18, 19. With its pressure piece 33 lying on the upper surface of each side wall 18, 19 of the housing 9, the resilient tongue 20 is adopted to clamp each side wall 18, 19 between the pressure piece 33 and the lower plate 24 in vertically spaced relation.

The main body 32 is formed with the engagement hole 21. As seen in FIG. 2, the housing 9 is slidingly inserted in the shell 10 from rear along an assembly direction Y1. After assembly, the housing 9 is locked in the shell 10 through engagement between the engaging projection 22 of the housing 9 and the engagement hole 21 of the shell 10 so that the housing 9 is prevented from slipping away in a counter-assembly direction Y2.

Specifically, the engaging projection 22 includes a slanted cam surface 34 inclined relative to the assembly direction Y1, and a locking surface 35 substantially orthogonal to the outside surface of each side wall 18, 19. When the housing 9 is inserted in the shell 10, the slanted cam surfaces 34 first come into abutment against edges of the resilient tongues 20 for briefly laterally distending the tongues, followed by the engaging projections 22 fitting in the engagement holes 21. Then, the locking surfaces 35 engage peripheral edges of the engagement holes 21 for prevention of slip off. Substantially in parallel with the engaging projections 22 fitting in the engagement holes 21, the front ends of the side walls 18, 19 abut against the corresponding front plates 25, 26 of the shell 10, which, in turn, act as a stopper for preventing the housing 9 from being displaced in the assembly direction Y1.

Figure 9:
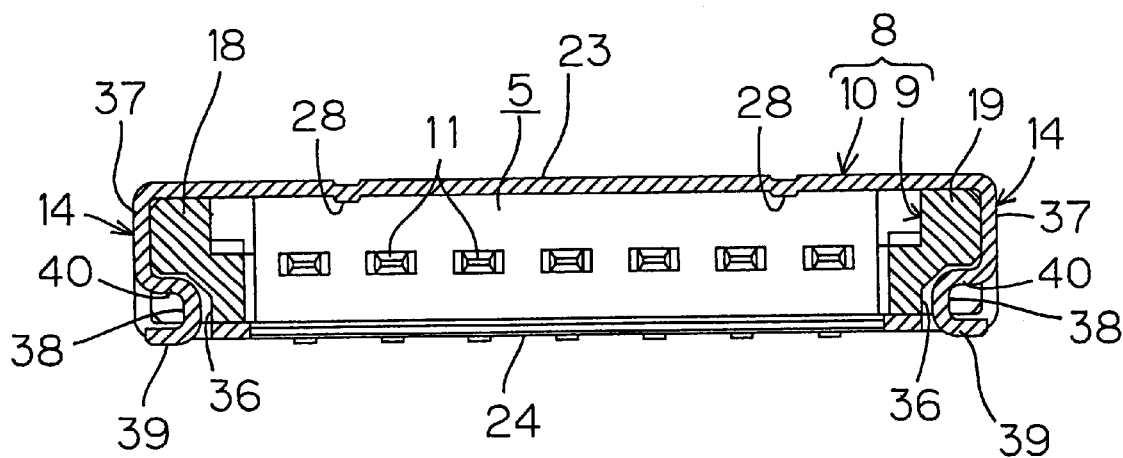
FIG. 9 is a sectional view taken on the line IX—IX in FIG. 5.

Referring to FIGS. 2 and 9, a front half portion of each side wall 18, 19 includes a recess 36 at a lower part of the outside surface thereof. The reinforcement tab 14 includes a first portion 37 conforming to an upper part of the outside surface of the side wall 18 or 19, and a second portion 38 as a bent portion continuous to the lowest end of the first portion 37 and accommodated in the recess 36. Thus, the reinforcement tab has the general form of a ladle.

The second portion 38 is comprised of a grooved portion laterally opened, having a leg 39 extended outward and an upper piece 40 in parallel relation with the leg 39. The leg 39 is securely soldered to the conductive portion 15 on the surface 2a of the printed wiring board 2(see FIG. 1).

The upper piece 40 of the reinforcement tab 14 of the shell 10 lies under a lower part of the side wall 18 or 19, acting to reinforce the interconnection between the shell 10 and the housing 9. As shown in FIGS. 5 and 9, the reinforcement tabs 14 with the legs 39 are located within an outline of the connector body 8 as viewed in plan.

The embodiment accomplishes the thin design by adopting a construction wherein the upper plane of the insertion space 5 is defined by the upper plate 23 of the shell 10. In addition, the base connector 1 occupies a smaller area on the printed wiring board 2 because the base connector 1 is secured to the printed wiring board 2 by the reinforcement tabs 14 confined in the outline of the connector body 8 as viewed in plan.

Specifically, the reinforcement tab 14 has its second portion 38 of U-shaped in section, or the bent portion projecting inwardly, accommodated in the recess 36 of the side wall 18 or 19 of the housing 9 so that even the outwardly extended leg 39 may be confined in the outline of the connector body 8. The outwardly extended leg 39 to be soldered provides easy repair of any solder failure found in the fabrication process.

In the shell 10 integrally formed of a metal sheet, the reinforcement tab 14 extends downward from its upper plate 23 to lie under the lower side of the side wall 18 or 19 while the resilient tongue 20 extends upward from its lower plate 24 to lie upon the upper surface of the side wall 18 or 19. This results in the reinforced interconnection between the housing 9 and the shell 10. As mentioned supra, the shell 10 is easy to fabricate because it is assembled by plural bendings of the intermediate in the same direction, the intermediate prepared by blanking the metal sheet.

Furthermore, the adequate elastic deformation is ensured because the disengagement between the housing 9 and the shell 10 is prevented by means of the engagement hole 21 formed in the resilient tongue 20 of the shell 10. This reduces the incidence of damage due to force fit, resulting in the reinforced interconnection between the shell 10 and the housing 9.

The pair of guide ribs 28 formed in the upper plate 23 of the shell 10 guide the socket connector 4 in insertion or removal, thereby preventing the socket connector from prising the shell during insertion or removal. In addition, the guide ribs 28 extended along the insertion direction X reduce the bending strain in the upper plate 23 of the shell 10 defining the upper plane of the insertion space 5. This is effective to prevent the deflection of the upper plate 23 particularly where a large number of contacts 11 are arranged to increase the transverse span of the upper plate 23 of the shell 10. The pair of guide ribs 28 may preferably be arranged in transversely spaced relation from the standpoint of preventing the shell from being prised.

It is noted that the present invention should not be limited to the above embodiment. In the case of a multipolar configuration, one or more additional guide ribs may be laid between the pair of guide ribs 28 in transversely spaced relation for the main purpose of preventing the deflection of the upper plate 23 of the shell 10.

Further, various other modifications and changes are possible within the scope of the invention.

What is claimed is:

1. A connector for printed wiring board having an insertion space for receiving its counterpart connector comprising:
   a connector body mounted on a printed wiring board, including,
   1) a synthetic-resin housing for retaining a plurality of contacts, the housing including a pair of side walls; and
   2) a metallic shell as an electromagnetic shield covering the housing, the shell being integrally formed from a metal sheet, including
      a) an upper plate defining a part of the insertion space,
      b) a first pair of extensions, each extension individually extended directly from said upper plate along one of the side walls of the housing, the pair of extensions correspondingly including a pair of legs extending outwardly on a surface of the printed wiring board and soldered to a conductive portion on the printed wiring board surface,
      c) a lower plate extending on the printed wiring board, and having first and second side edges,
      d) a second pair of extensions, each extension individually directly extending from either the first or second side edges of said lower plate along one of the side walls of the housing, and
      e) a front plate defining an insertion opening to the insertion space,
   wherein the upper and lower plates are connected via the front plate, and
   each of the first and second extensions includes engagement parts, each of which engages one of the side walls of the housing, the engagement preventing rotation of the upper and lower plates about the front plate.

2. A connector for printed wiring board according to claim 1, wherein the pair of side walls are each formed with a recess at a lower part of an outside surface thereof, and
   wherein the pair of extensions correspondingly include a pair of bent portions inwardly projected and accommodated in the corresponding recesses of the side walls.

3. A connector for printed wiring board according to claim 2, wherein the pair of bent portions correspondingly include the pair of legs.

4. A connector for printed wiring board according to claim 2, wherein the pair of bent portions correspondingly include a pair of grooved portions laterally opened.

5. A connector for printed wiring board according to claim 1, wherein the first pair of extensions is a pair of resilient tongues individually extended upward from said lower plate along the corresponding side walls of the housing.

6. A connector for printed wiring board according to claim 5, wherein the pair of resilient tongues correspondingly have a pair of pressure pieces extended from top ends thereof along corresponding upper surfaces of the side walls of the housing, and
   wherein the side walls of the housing are correspondingly clamped between the pair of pressure pieces and the lower plate.

7. A connector for printed wiring board according to claim 5, wherein the pair of resilient tongues are formed with engagement holes for engagement with corresponding projections formed on the side walls of the housing, thereby preventing the shell from slipping away from the housing.

8. A connector for printed wiring board according to claim 1, wherein the shell includes a pair of resilient tongues individually extended along the corresponding side walls of the housing, and
   wherein the pair of resilient tongues are formed with engagement holes for engagement with corresponding projections formed on the side walls of the housing, thereby preventing the shell from slipping away from the housing.

9. A connector for printed wiring board according to claim 1, wherein the upper plate of the shell is provided with a rib.

10. A connector for printed wiring board according to claim 9, wherein the rib projects into the insertion space and extends along a direction of insertion of the counterpart connector.

11. A connector for printed wiring board according to claim 10, wherein the rib slides in a groove of the counterpart connector in being inserted in the insertion space, thereby guiding the counterpart connector in insertion.

12. An electrical connector, comprising: a connector body, including,
   1) a housing for retaining a contact, said housing including a pair of side walls; and
   2) a shell covering the housing, including
      a) an upper plate defining a part of an insertion for receiving a complementary connector,
      b) a first pair of extensions, each extension individually extended directly from said upper plate along one of said side walls of said housing,
      c) a lower plate,
      d) a second pair of extensions, each extension individually directly extending from said lower plate along one of said side walls of said housing, and
      e) a front plate, defining an insertion opening in communication with the insertion space, that connects said upper plate and said lower plate,
   wherein each of said first and second extensions engages one of said side walls of said housing in opposite directions, the engagement preventing rotation of said upper and lower plates about said front plate.

13. A connector for printed wiring board according to claim 12, wherein the engagement parts of the first extensions further engage a lower surface of the housing, in addition to the side walls of the housing.

14. A connector for printed wiring board according to claim 12, wherein the engagement parts of the second extensions further engage an upper surface of the housing, in addition to the side walls of the housing.

15. A connector according to claim 1, wherein the engagement parts of the first extensions further engage a lower surface of the housing, in addition to the side walls of the housing.

16. A connector according to claim 1, wherein the engagement parts of the second extensions further engage an upper surface of the housing, in addition to the side walls of the housing.

17. A shell for a connector, comprising:
   a) an upper plate defining a part of an insertion for receiving a complementary connector,
   b) a first pair of extensions, each extension individually extendable directly from said upper late along a side wall of a housing to be held in said shell,
   c) a lower plate,
   d) a second pair of extensions, each extension individually directly extendable from said lower plate along one of the side walls of the housing, and
   e) a front plate defining an insertion opening in communication with the insertion space that connects said upper plate and said lower plate,
   wherein each of the first and second extensions includes engagement parts, each of which is engageable with one of the side walls of the housing in opposite directions, the engagement preventing rotation of the upper and lower plates about the front plate.

18. A connector according to claim 17, wherein the engagement parts of the first extensions are further engageable with a lower surface of the housing, in addition to the side walls of the housing.

19. A connector according to claim 17, wherein the engagement parts of the second extensions are further engageable with an upper surface of the housing, in addition to the side walls of the housing.

* * * * *